US012799327B2

(12) United States Patent
Chen et al.

(10) Patent No.: US 12,799,327 B2
(45) Date of Patent: Nov. 17, 2026

(54) RESIN COMPOSITION AND ARTICLE MADE THEREFROM

(71) Applicant: Elite Material Co., Ltd., Taoyuan City (TW)

(72) Inventors: Chun-Hung Chen, Taoyuan City (TW); Chen-Yu Hsieh, Taoyuan City (TW)

(73) Assignee: Elite Material Co., Ltd., Taoyuan City (TW)

( * ) Notice: Subject to any disclaimer, the term of this patent is extended or adjusted under 35 U.S.C. 154(b) by 609 days.

(21) Appl. No.: 18/348,599

(22) Filed: Jul. 7, 2023

(65) Prior Publication Data

US 2024/0409742 A1 Dec. 12, 2024

(30) Foreign Application Priority Data

Jun. 12, 2023 (TW) ................................ 112121778

(51) Int. Cl.

| | |
|---|---|
| ***C08L 79/08*** | (2006.01) |
| ***B32B 5/26*** | (2006.01) |
| ***B32B 15/14*** | (2006.01) |
| ***B32B 15/20*** | (2006.01) |
| ***C08G 73/02*** | (2006.01) |
| ***C08G 73/12*** | (2006.01) |
| ***C08J 5/24*** | (2006.01) |
| ***C08K 3/013*** | (2018.01) |
| ***C08K 3/22*** | (2006.01) |
| ***C08K 3/28*** | (2006.01) |
| ***C08K 3/34*** | (2006.01) |
| ***C08K 3/38*** | (2006.01) |
| ***H05K 1/03*** | (2006.01) |

(52) U.S. Cl.

CPC ................ *C08L 79/08* (2013.01); *B32B 5/26* (2013.01); *B32B 15/14* (2013.01); *B32B 15/20* (2013.01); *C08G 73/026* (2013.01); *C08G 73/12* (2013.01); *C08G 73/123* (2013.01); *C08G 73/127* (2013.01); *C08J 5/244* (2021.05); *C08J 5/249* (2021.05); *C08K 3/013* (2018.01); *C08K 3/22* (2013.01); *C08K 3/28* (2013.01); *C08K 3/34* (2013.01); *C08K 3/38* (2013.01); *H05K 1/036* (2013.01); *H05K 1/0373* (2013.01); *B32B 2260/021* (2013.01); *B32B 2260/046* (2013.01); *B32B 2262/101* (2013.01); *B32B 2307/302* (2013.01); *B32B 2307/546* (2013.01); *B32B 2457/08* (2013.01); *C08J 2379/08* (2013.01); *C08K 2003/222* (2013.01); *C08K 2003/2227* (2013.01); *C08K 2003/282* (2013.01); *C08K 2003/385* (2013.01); *C08K 2201/001* (2013.01); *C08L 2201/02* (2013.01); *C08L 2203/16* (2013.01); *C08L 2203/20* (2013.01)

(58) Field of Classification Search

CPC .. C08L 79/08; C08L 2201/02; C08L 2203/16; C08L 2203/20; C08L 63/00; C08L 83/04; C08L 71/126; C08G 73/026; C08G 73/12; C08G 73/123; C08G 73/127; C08J 5/244; C08J 2379/08; C08J 5/249; C08K 3/38; C08K 2003/385; C08K 2201/001; C08K 3/013; C08K 3/36; C08K 2003/2227; C08K 3/22; C08K 3/28; C08K 2003/222; C08K 2003/282; H05K 1/0373; H05K 1/036; B32B 5/26; B32B 15/14; B32B 15/20; B32B 2260/021; B32B 2260/046; B32B 2307/302; B32B 2307/546; B32B 2457/08

See application file for complete search history.

(56) References Cited

U.S. PATENT DOCUMENTS

2018/0327593 A1* 11/2018 Kasahara ................ H05K 3/46

* cited by examiner

*Primary Examiner* — Marc S Zimmer
*Assistant Examiner* — Virginia L Stonehocker
(74) *Attorney, Agent, or Firm* — MUNCY, GEISSLER, OLDS & LOWE, P.C.

(57) ABSTRACT

A resin composition includes 100 parts by weight of a prepolymer and 150 to 200 parts by weight of a ceramic filler, wherein: the prepolymer is prepared from a mixture subjected to a prepolymerization reaction, and the mixture includes a maleimide resin and a diamine compound in a molar ratio of between 1:2 and 2:1; the ceramic filler has a thermal conductivity of greater than 30 W/(m·K); and the diamine compound includes a compound of Formula (1), a compound of Formula (2), a compound of Formula (3) or a combination thereof. The resin composition may be used to make various articles, including a resin film, a prepreg, a laminate or a printed circuit board, and at least one or more properties can be improved.

14 Claims, No Drawings

RESIN COMPOSITION AND ARTICLE MADE THEREFROM

CROSS-REFERENCE TO RELATED APPLICATION

This application claims the priority benefits of Taiwan Patent Application No. 112121778, filed on Jun. 12, 2023. The entirety of the above-mentioned patent application is hereby incorporated by reference herein and made a part of this specification.

BACKGROUND

1. Field of the Disclosure

The present disclosure relates to a resin composition and more particularly to a resin composition useful for preparing a prepreg, a resin film, a laminate or a printed circuit board.

2. Description of Related Art

The overall power density of existing electronic equipment is gradually increasing, but the physical size of the electronic equipment and electronic components becomes relatively smaller and smaller, resulting in an increase in heat flux. Therefore, materials with high thermal conductivity can be used to achieve stable heat transfer and ensure that heat is less likely to accumulate locally. Otherwise, if the heat is blocked and accumulates, the components will fail due to overheating. The prior art has disclosed the use of fillers with thermal conductivity, but they fail to maintain excellent dielectric properties at the same time.

SUMMARY

To overcome the problems of prior arts, particularly one or more above-mentioned property demands facing conventional materials, it is a primary object of the present disclosure to provide a resin composition and an article made from the resin composition, which may achieve at least one or more desirable property improvements including dielectric constant, dissipation factor, thermal conductivity, copper foil peeling strength, routing distance, bending ability and elongation.

To achieve the above-mentioned object, the present disclosure provides a resin composition comprising 100 parts by weight of a prepolymer and 150 to 200 parts by weight of a ceramic filler, wherein:

the prepolymer is prepared from a mixture subjected to a prepolymerization reaction, and the mixture comprises a maleimide resin and a diamine compound in a molar ratio of between 1:2 and 2:1;

the ceramic filler has a thermal conductivity of greater than 30 W/(m·K); and the diamine compound comprises a compound of Formula (1), a compound of Formula (2), a compound of Formula (3) or a combination thereof:

Formula (1)

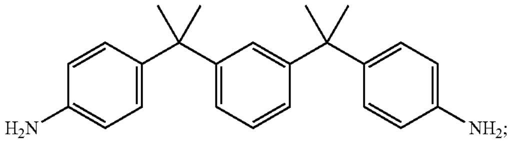

-continued

Formula (2)

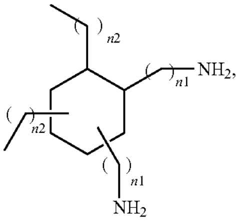

wherein each n1 is independently an integer of 6 to 8, and each n2 is independently an integer of 5 to 8;

Formula (3)

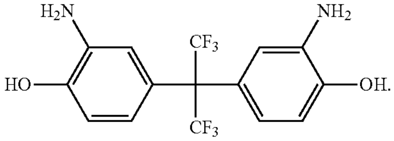

For example, in one embodiment, the ceramic filler comprises aluminum oxide, aluminum nitride, silicon carbide, boron nitride, silicon nitride, magnesium oxide, or a combination thereof.

For example, in one embodiment, the ceramic filler has a thermal conductivity of greater than 30 W/(m·K) and less than 320 W/(m·K).

For example, in one embodiment, the mixture is subjected to the prepolymerization reaction at 70 to 150 °C for 1 to 20 hours to prepare the prepolymer.

For example, in one embodiment, the conversion rate of the maleimide resin and the diamine compound is between 10% and 90%.

For example, in one embodiment, the maleimide resin comprises 4,4'-diphenylmethane bismaleimide, polyphenylmethane maleimide, bisphenol A diphenyl ether bismaleimide, 3,3'-dimethyl-5,5'-diethyl-4,4'-diphenylmethane bismaleimide, 3,3'-dimethyl-5,5'-dipropyl-4,4'-diphenylmethane bismaleimide, m-phenylene bismaleimide, 4-methyl-1,3-phenylene bismaleimide, 1,6-bismaleimide-(2,2,4-trimethyl)hexane, N-2,3-xylylmaleimide, N-2,6-xylyl maleimide, N-phenylmaleimide, vinyl benzyl maleimide, maleimide containing biphenyl structure, maleimide containing aliphatic long chain structure, prepolymer of diallyl compound and maleimide, prepolymer of multi-functional amine and maleimide, prepolymer of acid phenol compound and maleimide, or a combination thereof.

For example, in one embodiment, the resin composition further comprises epoxy resin, vinyl group-containing polyphenylene ether resin, flame retardant, curing accelerator, polymerization inhibitor, solvent, silane coupling agent, coloring agent, toughening agent, or a combination thereof.

Moreover, the present disclosure also provides an article made from the resin composition described above, which comprises a prepreg, a resin film, a laminate or a printed circuit board.

For example, in one embodiment, articles made from the resin composition disclosed herein have one, more or all of the following properties:

- a dielectric constant as measured by reference to JIS C2565 at 10 GHz of less than or equal to 5.05;
- a dissipation factor as measured by reference to JIS C2565 at 10 GHz of less than or equal to 0.0020;

a thermal conductivity as measured by reference to ASTM-D5470 of greater than or equal to 1.06 W/(m·K);

a copper foil peeling strength as measured by reference to IPC-TM-650 2.4.8 of greater than or equal to 4.0 lb/in;

a bending ability as measured by reference to JIS C 6471 of greater than or equal to 323 cycles;

an elongation as measured by reference to ASTM D412 of greater than or equal to 10.1%; and a routing distance of greater than or equal to 28 meters.

DESCRIPTION OF THE EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

While some theories or mechanisms may be proposed herein, the present disclosure is not bound by any theories or mechanisms described regardless of whether they are right or wrong, as long as the embodiments can be implemented according to the present disclosure.

As used herein, “a,” “an” or any similar expression is employed to describe components and features of the present disclosure. This is done merely for convenience and to give a general sense of the scope of the present disclosure. Accordingly, this description should be read to include one or at least one and the singular also includes the plural unless it is obvious to mean otherwise.

As used herein, “or a combination thereof” means “or any combination thereof”, and “any” means “any one”, vice versa.

As used herein, the term “comprises,” “comprising,” “includes,” “including,” “encompass,” “encompassing,” “has,” “having” or any other variant thereof is construed as an open-ended transitional phrase intended to cover a non-exclusive inclusion. For example, a composition or article of manufacture that comprises a list of elements is not necessarily limited to only those elements but may include other elements not expressly listed but inherent to such composition or article of manufacture. Further, unless expressly stated to the contrary, the term “or” refers to an inclusive or and not to an exclusive or. For example, a condition “A or B” is satisfied by any one of the following: A is true (or present) and B is false (or not present), A is false (or not present) and B is true (or present), and both A and B are true (or present). In addition, whenever open-ended transitional phrases are used, such as “comprises,” “comprising,” “includes,” “including,” “encompass,” “encompassing,” “has,” “having” or any other variant thereof, it is understood that transitional phrases such as “consisting essentially of” and “consisting of” are also disclosed and included.

As used herein, the term “and” or any other variant thereof is used to connect parallel sentence components, and there is no distinction between the front and rear components. The meaning of the parallel sentence components does not change in the grammatical sense after the position is exchanged.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of “1 to 8” should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Similarly, a range of “between 1 and 8” should be understood as explicitly disclosing all ranges such as 1 to 8, 1 to 7, 2 to 8, 2 to 6, 3 to 6, 4 to 8, 3 to 8 and so on and encompassing the end points of the ranges. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being “selected from a group consisting of $X_1$, $X_2$ and $X_3$,” it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being “selected from a group consisting of $X_1$, $X_2$ and $X_3$” and Y is described as being “selected from a group consisting of $Y_1$, $Y_2$ and $Y_3$,” the disclosure shall be interpreted as any combination of X is $X_1$ or $X_2$ or $X_3$ and Y is $Y_1$ or $Y_2$ or $Y_3$.

Unless otherwise specified, according to the present disclosure, a compound refers to a chemical substance formed by two or more elements bonded with chemical bonds and may comprise a small molecule compound and a polymer compound, but not limited thereto. Any compound disclosed herein is interpreted to not only include a single chemical substance but also include a class of chemical substances having the same kind of components or having the same property. In addition, as used herein, a mixture refers to a combination of two or more compounds.

Unless otherwise specified, the term “resin” of the present disclosure is a widely used common name of a synthetic polymer and is construed as comprising monomer and its combination, polymer and its combination or a combination of monomer and its polymer, but not limited thereto.

Unless otherwise specified, according to the present disclosure, a modification comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc.

As used herein, a prepolymer refers to a product, derived from a compound or a mixture (monomer) that is subjected to prepolymerization (partial polymerization), contains unreacted reactive functional groups or has the potential to undergo further polymerization. For example, the progress of the prepolymerization reaction may be confirmed and controlled as needed by determining the molecular weight or the level of viscosity. Prepolymerization reaction disclosed herein may be initiated by the use of solvent and heating or by a thermal melting reaction, but not limited thereto. For example, prepolymerization by the use of solvent and heating refers to dissolving the raw material in a solvent, optionally adding a catalyst or a polymerization inhibitor, followed by heating after all components are melted in the solvent, so as to initiate the prepolymerization reaction. For example, the suitable solvent comprises butanone, methanol, ethanol, ethylene glycol monomethyl ether, acetone, methyl isobutyl ketone, cyclohexanone, toluene, xylene, methoxyethyl acetate, ethoxyethyl acetate, propoxyethyl acetate, ethyl acetate, propylene glycol methyl ether, dimethyl formamide, dimethyl acetamide, N-methyl-pyrrolidone, or a combination thereof. Prepolymerization by a thermal melting reaction refers to heating to melt the raw material and at the same time initiate the prepolymerization reaction. The product after prepolymerization (i.e., the prepolymer) has a molecular weight of greater than that of the compound monomer or mixture monomer prior to prepolymerization and may be analyzed by a gel permeation chromatograph (GPC). In the graph of retention time (X-axis) and molecular weight (Y-axis), the distribution peak of molecular weight of the prepolymer is located closer to the Y-axis (shorter retention time), and the distribution peak of molecular weight of the monomer is located behind (longer retention time). In addition, the prepolymer obtained has a wider distribution of molecular weight that contains multiple adjacent peaks, while the monomer has a narrower distribution of molecular weight that contains only one peak.

To those of ordinary skill in the art to which this disclosure pertains, a resin composition containing an additive and two compounds (e.g., A and B), a total of three components, is different form a resin composition containing the additive and a prepolymer formed by the two compounds (e.g., A and B), a total of two components, as they are completely different from each other in the aspects of preparation method, physical or chemical properties of the resin composition and properties of an article or product made therefrom. For example, the former involves mixing A, B and the additive to form the resin composition; in contrast, the latter involves first subjecting a mixture comprising A and B to a prepolymerization reaction at proper conditions to form a prepolymer and then mixing the prepolymer with the additive to form the resin composition. For example, to those of ordinary skill in the art to which this disclosure pertains, the two resin compositions have completely different compositions; in addition, because the prepolymer formed by A and B functions completely different from A and B individually or collectively in the resin composition, the two resin compositions should be construed as completely different chemical substances and have completely different chemical statuses. For example, to those of ordinary skill in the art to which this disclosure pertains, because the two resin compositions are completely different chemical substances, articles made therefrom will not have the same properties. For example, to a resin composition containing a crosslinking agent and a prepolymer formed by A and B, since A and B have been partially reacted or converted during the prepolymerization reaction to form the prepolymer, during the process of heating to semi-cure the resin composition at a high temperature condition, a partial crosslinking reaction occurs between the prepolymer and the crosslinking agent but not between A and B individually and the crosslinking agent. As such, articles made from the two resin compositions will be completely different and have completely different properties.

As used herein, "vinyl group-containing" refers to the presence of an ethylenic carbon-carbon double bond (C═C) or a functional group derived therefrom in a compound. Therefore, examples of "vinyl group-containing" may include, but not limited to, a structure containing a vinyl group, an allyl group, a vinylbenzyl group, a methacrylate group or the like. Unless otherwise specified, the position of the aforesaid functional group is not particularly limited and may be located at the terminal of a long-chain structure. Therefore, for example, a vinyl group-containing polyphenylene ether resin represents a polyphenylene ether resin containing a vinyl group, an allyl group, a vinylbenzyl group, a methacrylate group or the like, but not limited thereto.

As used herein, part(s) by weight represents weight part(s) in any weight unit, such as but not limited to gram, kilogram, pound and so on. For example, 100 parts by weight of the prepolymer may represent 100 grams of the prepolymer, 100 kilograms of the prepolymer or 100 pounds of the prepolymer, but not limited thereto. As used herein, if the amounts of different components are presented in a proportional relationship, the actual amounts can be any amounts that conform to the proportional relationship.

The following embodiments and examples are illustrative in nature and are not intended to limit the present disclosure and its application. In addition, the present disclosure is not bound by any theory described in the background and summary above or the following embodiments or examples.

As described above, a primary object of the present disclosure is to provide a resin composition comprising 100 parts by weight of a prepolymer and 150 to 200 parts by weight of a ceramic filler, wherein:

the prepolymer is prepared from a mixture subjected to a prepolymerization reaction, and the mixture comprises a maleimide resin and a diamine compound in a molar ratio of between 1:2 and 2:1;

the ceramic filler has a thermal conductivity of greater than 30 W/(m·K); and the diamine compound comprises a compound of Formula (1), a compound of Formula (2), a compound of Formula (3) or a combination thereof:

Formula (1)

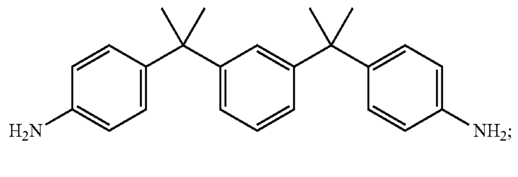

-continued

Formula (2)

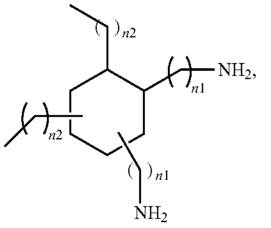

wherein each n1 is independently an integer of 6 to 8, and each n2 is independently an integer of 5 to 8;

Formula (3)

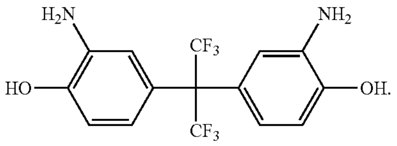

The conditions of the prepolymerization reaction are not particularly limited and may be adjusted by those skilled in the art without undue experimentation. For example, in one embodiment, the prepolymerization reaction is performed in the presence of a catalyst at 70 to 150 °C for 1 to 20 hours, and the prepolymerization reaction has a conversion rate of between 10% and 90%.

For example, the prepolymerization reaction described in the present disclosure refers to a conversion rate of the maleimide of greater than 0% and less than 100% (exclusive of 0% and 100%), and a conversion rate of the compound of Formula (1), the compound of Formula (2), the compound of Formula (3) or a combination thereof of greater than 0% and less than 100% (exclusive of 0% and 100%). That is, an overall conversion rate of the maleimide and any one or more of the diamine compounds is greater than 0% and less than 100% (exclusive of 0% and 100%). In one embodiment, an overall conversion rate of the maleimide and any one or more of the diamine compounds is between 10% and 90%.

Unless otherwise specified, the catalyst suitable for a prepolymerization reaction of the aforesaid mixture may comprise but not limited to (triethyl)amine (TEA), pyridine, imidazole, boron trifluoride-amine complex, 2-methylimidazole (2MI), 2-phenyl-1H-imidazole (2PZ), 2-ethyl-4-methylimidazole (2E4MI), 4-dimethylaminopyridine (DMAP) or tertiary amine.

According to the present disclosure, a ceramic filler refers to a kind of inorganic non-metallic filler made through forming, sintering and other steps, and the bonding bonds of its constituent phases are ionic bonds, covalent bonds or mixed bonds of ionic bonds and covalent bonds. For example, in one embodiment, the ceramic filler comprises aluminum oxide, aluminum nitride, silicon carbide, boron nitride, silicon nitride, magnesium oxide, or a combination thereof. In the resin composition of the present disclosure, the ceramic filler may be used alone or in combination of two or more. From the viewpoints of thermal conductivity and improving dielectric properties, toughness and bending ability, etc., the ceramic filler preferably comprises boron nitride, aluminum nitride, magnesium oxide or a combination thereof. Unless otherwise specified, the shape of the ceramic filler is not particularly limited and may be, for example, plate-like, spherical, amorphous (irregular), broken, polygonal, and the like.

According to the present disclosure, the ceramic filler has a thermal conductivity of greater than 30 W/(m·K), preferably greater than 35 W/(m·K). The upper limit of the thermal conductivity of a ceramic filler is not particularly limited. To those of ordinary skill in the art to which this disclosure pertains, the thermal conductivity of most ceramic fillers may be for example less than 320 W/(m·K), preferably less than 200 W/(m·K).

According to the present disclosure, the type of the maleimide resin suitable for the prepolymerization reaction is not particularly limited. For example, the maleimide resin may comprise 4,4'-diphenylmethane bismaleimide, polyphenylmethane maleimide (a.k.a. oligomer of phenylmethane maleimide), bisphenol A diphenyl ether bismaleimide, 3,3'-dimethyl-5,5'-diethyl-4,4'-diphenylmethane bismaleimide, 3,3'-dimethyl-5,5'-dipropyl-4,4'-diphenylmethane bismaleimide, m-phenylene bismaleimide, 4-methyl-1,3-phenylene bismaleimide, 1,6-bismaleimide-(2,2,4-trimethyl) hexane, N-2,3-xylylmaleimide, N-2,6-xylylmaleimide, N-phenyl maleimide, vinyl benzyl maleimide (VBM), maleimide containing a biphenyl structure, maleimide resin containing aliphatic long chain structure, prepolymer of diallyl compound and maleimide resin, prepolymer of multi-functional amine and maleimide resin (multi-functional amine includes two or more amine functional groups), prepolymer of acid phenol compound and maleimide resin, or a combination thereof. These components should be construed as including their modifications.

For example, examples of the maleimide resin include but are not limited to products such as BMI-1000, BMI-1000H, BMI-1100, BMI-1100H, BMI-2000, BMI-2300, BMI-3000, BMI-3000H, BMI-4000, BMI-5000, BMI-5100, BMI-TMH, BMI-7000, and BMI-7000H available from Daiwakasei Industry, products such as BMI-70 and BMI-80 available from K.I Chemical Industry Co., Ltd., or products such as MIR-3000 and MIR-5000 available from Nippon Kayaku. For example, examples of the maleimide resin containing aliphatic long chain structure (such as containing C5 to C50 aliphatic long chain structure) include, but are not limited to, products such as BMI-689, BMI-1400, BMI-1500, BMI-1700, BMI-2500, BMI-3000, BMI-5000 and BMI-6000 available from Designer Molecules Inc.

Unless otherwise specified, the maleimide resin may be used alone or in combination of two or more.

In addition to the aforesaid components, the resin composition disclosed herein may also further optionally comprise epoxy resin, vinyl group-containing polyphenylene ether resin, flame retardant, curing accelerator, polymerization inhibitor, solvent, silane coupling agent, coloring agent, toughening agent, or a combination thereof.

The epoxy resin may be any epoxy resins known in the field to which this disclosure pertains, including but not limited to bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin, o-cresol novolac epoxy resin or copolymer of epoxy resin and silicone resin; wherein, the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may comprise DOPO-containing phenol novolac epoxy resin, DOPO-containing cresol novolac epoxy resin, DOPO-containing bisphenol-A novolac epoxy resin, or a combination thereof; the DOPO-HQ epoxy resin may comprise DOPO-HQ-containing phenol novolac epoxy resin, DOPO-HQ-containing o-cresol novolac epoxy resin, DOPO-HQ-containing bisphenol-A novolac epoxy resin, dimer acid-modified epoxy resin, or a combination thereof. Unless otherwise specified, the amount of the epoxy resin described above is not particularly limited and may for example range from 4 parts by weight to 20 parts by weight of the epoxy resin relative to 100 parts by weight of the prepolymer, preferably range from 4 parts by weight to 12 parts by weight of the epoxy resin relative to 100 parts by weight of the prepolymer.

The vinyl group-containing polyphenylene ether resin may include but not limited to a polyphenylene ether resin containing a vinyl group, an allyl group, a vinylbenzyl group, or a methacrylate group. For example, in one embodiment, the vinyl group-containing polyphenylene ether resin comprises a vinylbenzyl group-containing biphenyl polyphenylene ether resin, a methacrylate group-containing polyphenylene ether resin (i.e., methacryloyl group-containing polyphenylene ether resin), an allyl group-containing polyphenylene ether resin, a vinylbenzyl group-modified bisphenol A polyphenylene ether resin, a chain-extended vinyl group-containing polyphenylene ether resin or a combination thereof. For example, the vinyl group-containing polyphenylene ether resin may be a vinylbenzyl-containing biphenyl polyphenylene ether resin with a number average molecular weight of about 1200 (such as OPE-2st 1200, available from Mitsubishi Gas Chemical Co., Inc.), a vinylbenzyl-containing biphenyl polyphenylene ether resin with a number average molecular weight of about 2200 (such as OPE-2st 2200, available from Mitsubishi Gas Chemical Co., Inc.), a methacrylate-containing polyphenylene ether resin with a number average molecular weight of about 1900 to 2300 (such as SA9000, available from Sabic), a vinylbenzyl-modified bisphenol A polyphenylene ether resin with a number average molecular weight of about 2400 to 2800, a chain-extended vinyl group-containing polyphenylene ether resin with a number average molecular weight of about 2200 to 3000, or a combination thereof. The chain-extended vinyl group-containing polyphenylene ether resin may include various polyphenylene ether resins disclosed in the US Patent Application Publication No. 2016/0185904 A1, all of which are incorporated herein by reference in their entirety. Unless otherwise specified, the amount of the vinyl group-containing polyphenylene ether resin described above is not particularly limited and may for example range from 1 part by weight to 30 parts by weight of the vinyl group-containing polyphenylene ether resin relative to 100 parts by weight of the prepolymer, preferably range from 1 part by weight to 23 parts by weight of the vinyl group-containing polyphenylene ether resin relative to 100 parts by weight of the prepolymer.

For example, the flame retardant used herein may be any one or more flame retardants useful for preparing a prepreg, a resin film, a laminate or a printed circuit board, examples including but not limited to a phosphorus-containing flame retardant, preferably comprising ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO (9,10-dihydro-9-oxa-10-phosphaphenanthrene-10-oxide) and its derivatives or resins, DPPO (diphenylphosphine oxide) and its derivatives or resins, melamine cyanurate, tri-hydroxy ethyl isocyanurate, aluminium phosphinate (e.g., commercially available OP-930 and OP-935), and a combination thereof.

For example, the flame retardant may be a DPPO compound (e.g., di-DPPO compound, such as commercially available PQ-60), a DOPO compound (e.g., di-DOPO compound), a DOPO resin (e.g., DOPO-HQ, DOPO-NQ, DOPO-PN, and DOPO-BPN) and a DOPO-containing epoxy resin, wherein DOPO-PN is a DOPO phenol novolac compound, and DOPO-BPN may be a DOPO-containing bisphenol novolac compound, such as DOPO-BPAN (DOPO-bisphenol A novolac), DOPO-BPFN (DOPO-bisphenol F novolac) or DOPO-BPSN (DOPO-bisphenol S novolac).

For example, the curing accelerator (including curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methyl imidazole (2E4MI), triphenylphosphine (TPP), 3-(2-phenyl-1H-imidazol-1-yl) propanenitrile (2PZ-CN) and 4-dimethylaminopyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl) benzene or a combination thereof. Unless otherwise specified, the amount of the curing accelerator is not particularly limited and may for example range from 0.10 part by weight to 0.35 part by weight of the curing accelerator relative to 100 parts by weight of the prepolymer.

For example, the polymerization inhibitor may comprise, but not limited to, 1,1-diphenyl-2-picrylhydrazyl radical, methyl acrylonitrile, 2,2,6,6-tetramethyl-1-oxo-piperidine, dithioester, nitroxide-mediated radical, triphenylmethyl radical, metal ion radical, sulfur radical, hydroquinone, 4-methoxyphenol, p-benzoquinone, phenothiazine, β-phenylnaphthylamine, 4-t-butylcatechol, methylene blue, 4,4'-butylidenebis(6-t-butyl-3-methylphenol), 2,2'-methylenebis (4-ethyl-6-t-butyl phenol) or a combination thereof. For example, the nitroxide-mediated radical may comprise, but not limited to, nitroxide radicals derived from cyclic hydroxylamines, such as 2,2,6,6-substituted piperidine 1-oxyl free radical, 2,2,5,5-substituted pyrrolidine 1-oxyl free radical or the like. Preferred substitutes include alkyl groups with 4 or fewer carbon atoms, such as methyl group or ethyl group. Examples of the compound containing a nitroxide radical include but are not limited to 2,2,6,6-tetramethyl piperidine 1-oxyl free radical, 2,2,6,6-tetraethylpiperidine 1-oxyl free radical, 2,2,6,6-tetramethyl-4-oxo-piperidine 1-oxyl free radical, 2,2,5,5-tetramethylpyrrolidine 1-oxyl free radical, 1,1,3,3-tetramethyl-2-isoindoline oxygen radical, N,N-di-tert-butyl amine oxygen free radical and so on. Nitroxide radicals may also be replaced by using stable radicals such as galvinoxyl radicals. The polymerization inhibitor suitable for the resin composition of the present disclosure may include products derived from the polymerization inhibitor with its hydrogen atom or group substituted by other atom or group. Examples include products derived from a polymerization inhibitor with its hydrogen atom substituted by an amino group, a hydroxyl group, a carbonyl group or the like.

For example, the solvent suitable for the resin composition of the present disclosure is not particularly limited and may be any solvent suitable for dissolving the resin composition disclosed herein, examples including, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl propoxyethyl acetate, ethyl acetate, dimethylformamide, dimethylacetamide, propylene glycol methyl ether, or a mixture thereof. The amount of solvent is not particularly limited and may be adjusted according to the viscosity required for the resin composition.

For example, the silane coupling agent may comprise silane (such as but not limited to siloxane) and may be further categorized according to the functional groups into amino silane, epoxide silane, vinyl silane, acrylate silane, methacrylate silane, hydroxyl silane, isocyanate silane, methacryloxy silane and acryloxy silane.

For example, the coloring agent may comprise but not limited to dye or pigment.

As used herein, the purpose of adding toughening agent is to improve the toughness of the resin composition. For example, the toughening agent may comprise, but not limited to, carboxyl-terminated butadiene acrylonitrile rubber (CTBN rubber), core-shell rubber, or a combination thereof.

The resin composition of various embodiments may be processed to make different articles, such as those suitable for use as components in electronic products, including but not limited to a prepreg, a resin film, a laminate or a printed circuit board.

For example, the resin composition from each embodiment of this disclosure can be used to make a prepreg, which comprises a reinforcement material and a layered structure disposed thereon. The layered structure is formed by heating the resin composition at a high temperature to the semi-cured state (B-stage). Suitable baking temperature for making a prepreg may be for example 80 °C to 150 °C, preferably 100 °C to 120 °C The reinforcement material may be any one of a fiber material, woven fabric, and non-woven fabric, and the woven fabric preferably comprises fiberglass fabrics. Types of fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

For example, the resin composition from each embodiment of this disclosure can be used to make a resin film, which is prepared by heating and baking to semi-cure the resin composition. The resin composition may be selectively coated on a polyethylene terephthalate film (PET film), a polyimide film (PI film), a copper foil or a resin-coated copper, followed by heating and baking at 100 °C to 120 °C for 5 to 15 minutes to semi-cure the resin composition to form the resin film.

For example, the resin composition from each embodiment of this disclosure can be used to make a laminate, which comprises two metal foils and an insulation layer disposed between the metal foils, wherein the insulation layer is made by curing the resin composition at high temperature and high pressure to the C-stage, a suitable curing temperature being for example between 180 °C and 240 °C and preferably between 200 °C and 220 °C and a suitable curing time being 80 to 140 minutes and preferably 90 to 120 minutes. The insulation layer may be formed by curing the aforesaid prepreg or resin film to the C-stage. The metal foil may comprise copper, aluminum, nickel, platinum, silver, gold or alloy thereof, such as a copper foil. In one embodiment, the laminate is a copper-clad laminate (CCL).

In addition, the laminate may be further processed by trace formation processes to make a circuit board, such as a printed circuit board.

In one embodiment, the resin composition disclosed herein may achieve improvement in one or more of the following properties: dielectric constant, dissipation factor, thermal conductivity, copper foil peeling strength, routing distance, bending ability and elongation.

For example, the resin composition according to the present disclosure or the article made therefrom may achieve one, more or all of the following properties:

- a dielectric constant as measured by reference to JIS C2565 at 10 GHz of less than or equal to 5.05, such as a dielectric constant of between 4.13 and 5.05;
- a dissipation factor as measured by reference to JIS C2565 at 10 GHz of less than or equal to 0.0020, such as a dissipation factor of between 0.0013 and 0.0020;
- a thermal conductivity as measured by reference to ASTM-D5470 of greater than or equal to 1.06 W/(m·K), such as a thermal conductivity of between 1.06 W/(m·K) and 1.76 W/(m·K);
- a copper foil peeling strength as measured by reference to IPC-TM-650 2.4.8 of greater than or equal to 4.0 lb/in, such as a copper foil peeling strength of between 4.0 lb/in and 4.7 lb/in;
- a bending ability as measured by reference to JIS C 6471 of greater than or equal to 323 cycles, such as a bending ability of between 323 cycles and 487 cycles;
- an elongation as measured by reference to ASTM D412 of greater than or equal to 10.1%, such as an elongation of between 10.1% and 16.6%; and
- a routing distance of greater than or equal to 28 meters, such as a routing distance of between 28 meters and 31 meters.

Methods for measuring the aforesaid properties will be elaborated in detail below.

Various prepolymers were prepared according to the descriptions in Preparation Example 1 to Preparation Example 12 using the amount (molar ratio) of monomers for prepolymerization reaction as listed in Table 1 and Table 2. In addition, raw materials below were used to prepare the resin compositions of various Examples and Comparative Examples of the present disclosure according to the amount listed in Table 3 to Table 7 and further fabricated to prepare test samples.

Materials and reagents used in Preparation Examples of prepolymer and Examples and Comparative Examples of resin composition disclosed herein are listed below:

BMI-80: bisphenol A diphenyl ether bismaleimide, available from K.I Chemical Industry Co., Ltd.

BMI-TMH: 1,6-bismaleimide-(2,2,4-trimethyl)hexane, available from Sichuan EM Technology Co., Ltd.

Compound of Formula (1): diamine compound, as shown below, available from Mitsui Chemicals.

Formula (1)

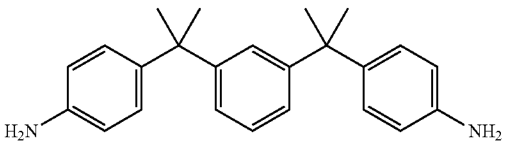

Compound of Formula (2-1): diamine compound, as shown below, available from Chingtide Co., Ltd.

Formula (2-1)

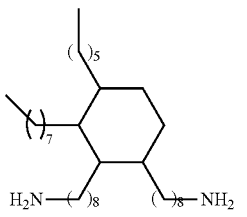

Compound of Formula (2-2): diamine compound, as shown below, available from Chingtide Co., Ltd.

Formula (2-2)

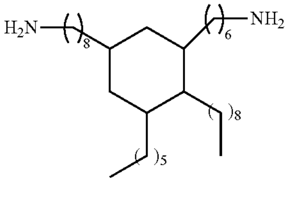

Compound of Formula (2-3): diamine compound, as shown below, available from Chingtide Co., Ltd.

Formula (2-3)

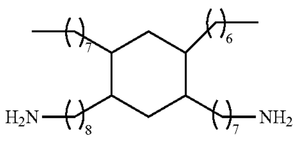

Compound of Formula (3): diamine compound, as shown below, available from Tong Sing Chemicals Co., Ltd.

Formula (3)

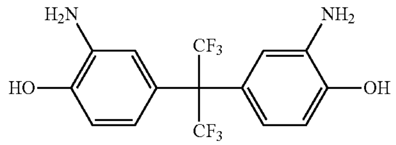

ODA: 4,4'-oxydianiline, commercially available.

Triethylamine: TEA, N,N-diethylethanamine, commercially available.

MEK: butanone (methyl ethyl ketone), commercially available.

BN: boron nitride, having a thermal conductivity of 60 W/(m·K), available from Tokuyama Corporation.

AlN: aluminum nitride, having a thermal conductivity of 180 W/(m·K), available from Tokuyama Corporation.

MgO: magnesium oxide, having a thermal conductivity of 36 W/(m·K), available from UBE Corporation.

ZnO: zinc oxide, having a thermal conductivity of 10 W/(m·K), available from Union Chemical Ind. Co.

$SiO_2$: silica, having a thermal conductivity of 5 W/(m·K), available from ADAMATECH.

NC-3000: biphenyl group-containing epoxy resin, available from Nippon Kayaku. BE-188: bisphenol A epoxy resin, available from Chang Chun Plastics.

Albiflex297: epoxy-silicone copolymer, available from Evonik.

SA9000: methacrylate-containing polyphenylene ether resin, available from Sabic. 2PZ-CN: 1-cyanoethyl-2-phenylimidazole, available from Shikoku Chemicals Corp.

Preparation Example 1

BMI-80 and the compound of Formula (1) (in a molar ratio of 2:1) were added to a three-necked flask, and triethylamine was optionally added (as a catalyst, and other catalysts may be used, such as pyridine, imidazole, boron trifluoride-amine complex, 2-methylimidazole, 2-phenylimidazole, 2-ethyl-4-methylimidazole, 4-dimethyl aminopyridine or tertiary amine), followed by adding an appropriate amount of MEK (as a solvent, and other solvents may be used, such as methanol, ethanol, ethylene glycol monomethyl ether, acetone, methyl isobutyl ketone, cyclohexanone, toluene, xylene, methoxyethyl acetate, ethoxyethyl acetate, propoxyethyl acetate, ethyl acetate, propylene glycol methyl ether, dimethylformamide, dimethylacetamide, N-methylpyrrolidone or a combination thereof) and stirring continuously to obtain a mixture solution. The mixture solution was heated from room temperature to 90 °C and continuously stirred for 4 hours, followed by cooled down to room temperature and filtered for removing impurities so as to obtain a prepolymer solution with a solid content of about 55%, which is the Prepolymer 1 of the present disclosure.

Preparation Example 2

Substantially the same as Preparation Example 1, except that the compound of Formula (1) was replaced by the compound of Formula (2-1), and the Prepolymer 2 of the present disclosure was obtained after synthesis.

Preparation Example 3

Substantially the same as Preparation Example 1, except that the compound of Formula (1) was replaced by the compound of Formula (2-2), and the Prepolymer 3 of the present disclosure was obtained after synthesis.

Preparation Example 4

Substantially the same as Preparation Example 1, except that the compound of Formula (1) was replaced by the compound of Formula (2-3), and the Prepolymer 4 of the present disclosure was obtained after synthesis.

Preparation Example 5

Substantially the same as Preparation Example 1, except that BMI-TMH and the compound of Formula (3) (in a molar ratio of 2:1) were used to perform a prepolymerization reaction, and the Prepolymer 5 of the present disclosure was obtained after synthesis.

Preparation Example 6

Substantially the same as Preparation Example 1, except that BMI-80 was replaced by BMI-TMH, and the Prepolymer 6 of the present disclosure was obtained after synthesis.

Preparation Example 7

Substantially the same as Preparation Example 1, except that BMI-80, the compound of Formula (1) and the compound of Formula (2-1) (in a molar ratio of 4:1:1) were used to perform a prepolymerization reaction, and the Prepolymer 7 of the present disclosure was obtained after synthesis.

Preparation Example 8

Substantially the same as Preparation Example 1, except that the molar ratio of BMI-80 and the compound of Formula (1) was 1:1, and the Prepolymer 8 of the present disclosure was obtained after synthesis.

Preparation Example 9

Substantially the same as Preparation Example 1, except that the molar ratio of BMI-80 and the compound of Formula (1) was 1:2, and the Prepolymer 9 of the present disclosure was obtained after synthesis.

Preparation Example 10

Substantially the same as Preparation Example 1, except that the compound of Formula (1) was replaced by ODA, and the Prepolymer 10 was obtained after synthesis.

Preparation Example 11

Substantially the same as Preparation Example 1, except that the molar ratio of BMI-80 and the compound of Formula (1) was 1:4, and the Prepolymer 11 was obtained after synthesis.

Preparation Example 12

Substantially the same as Preparation Example 1, except that the molar ratio of BMI-80 and the compound of Formula (1) was 4:1, and the Prepolymer 12 was obtained after synthesis.

TABLE 1

| Amount (molar ratio) of monomers used in preparing different prepolymers | | | | | | |
|---|---|---|---|---|---|---|
| Monomer | Prepolymer 1 | Prepolymer 2 | Prepolymer 3 | Prepolymer 4 | Prepolymer 5 | Prepolymer 6 |
| BMI-80 | 2 | 2 | 2 | 2 | | |
| BMI-TMH | | | | | 2 | 2 |
| Formula (1) | 1 | | | | | 1 |
| Formula (2-1) | | 1 | | | | |
| Formula (2-2) | | | 1 | | | |
| Formula (2-3) | | | | 1 | | |
| Formula (3) | | | | | 1 | |
| ODA | | | | | | |

TABLE 2

| Amount (molar ratio) of monomers used in preparing different prepolymers | | | | | | |
|---|---|---|---|---|---|---|
| Monomer | Prepolymer 7 | Prepolymer 8 | Prepolymer 9 | Prepolymer 10 | Prepolymer 11 | Prepolymer 12 |
| BMI-80 | 4 | 1 | 1 | 2 | 1 | 4 |
| BMI-TMH | | | | | | |
| Formula (1) | 1 | 1 | 2 | | 4 | 1 |
| Formula (2-1) | 1 | | | | | |
| Formula (2-2) | | | | | | |
| Formula (2-3) | | | | | | |
| Formula (3) | | | | | | |
| ODA | | | | 1 | | |

Compositions and test results of resin compositions of Examples and Comparative Examples are listed below (in part by weight).

TABLE 3

| Resin compositions of Examples (in part by weight) and test results | | | | | | |
|---|---|---|---|---|---|---|
| Component | Name | E1 | E2 | E3 | E4 | E5 |
| Prepolymer | Prepolymer 1 | 100 | | | | |
| | Prepolymer 2 | | 100 | | | |
| | Prepolymer 3 | | | 100 | | |
| | Prepolymer 4 | | | | 100 | |
| | Prepolymer 5 | | | | | 100 |
| | Prepolymer 6 | | | | | |
| | Prepolymer 7 | | | | | |
| | Prepolymer 8 | | | | | |
| | Prepolymer 9 | | | | | |
| | Prepolymer 10 | | | | | |
| | Prepolymer 11 | | | | | |
| | Prepolymer 12 | | | | | |
| Monomer | BMI-80 | | | | | |
| | BMI-TMH | | | | | |
| | Formula (1) | | | | | |
| | Formula (2-1) | | | | | |
| | Formula (2-2) | | | | | |
| | Formula (2-3) | | | | | |
| | Formula (3) | | | | | |
| Ceramic filler | BN | 180 | 180 | 180 | 180 | 180 |
| | AlN | | | | | |
| | MgO | | | | | |
| Other filler | ZnO | | | | | |
| | $SiO_2$ | | | | | |
| Additive | NC-3000 | | | | | |
| | BE-188 | | | | | |
| | Albiflex297 | | | | | |
| | SA9000 | | | | | |
| Catalyst | 2PZ-CN | 0.25 | 0.25 | 0.25 | 0.25 | 0.25 |
| Solvent | MEK | 150 | 150 | 150 | 150 | 150 |
| Property | Unit | E1 | E2 | E3 | E4 | E5 |
| dielectric constant | none | 4.90 | 4.23 | 4.24 | 4.14 | 4.16 |
| dissipation factor | none | 0.0019 | 0.0014 | 0.0014 | 0.0013 | 0.0014 |
| thermal conductivity | W/(m · K) | 1.20 | 1.22 | 1.26 | 1.25 | 1.24 |
| copper foil peeling strength | lb/in | 4.1 | 4.2 | 4.2 | 4.2 | 4.2 |
| routing distance | m | 28 | 28 | 28 | 28 | 29 |
| bending ability | cycle | 370 | 451 | 453 | 454 | 476 |
| elongation | % | 11.2 | 12.1 | 11.5 | 11.2 | 11.9 |

TABLE 4

| Resin compositions of Examples (in part by weight) and test results | | | | | | |
|---|---|---|---|---|---|---|
| Component | Name | E6 | E7 | E8 | E9 | E10 |
| Prepolymer | Prepolymer 1 | | 100 | 100 | | |
| | Prepolymer 2 | | | | | |
| | Prepolymer 3 | | | | | |
| | Prepolymer 4 | | | | | |
| | Prepolymer 5 | | | | | |
| | Prepolymer 6 | 100 | | | | |
| | Prepolymer 7 | | | | | |
| | Prepolymer 8 | | | | 100 | |
| | Prepolymer 9 | | | | | 100 |
| | Prepolymer 10 | | | | | |
| | Prepolymer 11 | | | | | |
| | Prepolymer 12 | | | | | |
| Monomer | BMI-80 | | | | | |
| | BMI-TMH | | | | | |
| | Formula (1) | | | | | |
| | Formula (2-1) | | | | | |
| | Formula (2-2) | | | | | |
| | Formula (2-3) | | | | | |
| | Formula (3) | | | | | |

TABLE 4-continued

| Resin compositions of Examples (in part by weight) and test results | | | | | | |
|---|---|---|---|---|---|---|
| Ceramic filler | BN | 180 | | | 180 | 180 |
| | AlN | | 180 | | | |
| | MgO | | | 180 | | |
| Other filler | ZnO | | | | | |
| | $SiO_2$ | | | | | |
| Additive | NC-3000 | | | | | |
| | BE-188 | | | | | |
| | Albiflex297 | | | | | |
| | SA9000 | | | | | |
| Catalyst | 2PZ-CN | 0.25 | 0.25 | 0.25 | 0.25 | 0.25 |
| Solvent | MEK | 150 | 150 | 150 | 150 | 150 |
| Property | Unit | E6 | E7 | E8 | E9 | E10 |
| dielectric constant | none | 4.75 | 4.51 | 5.05 | 4.85 | 4.56 |
| dissipation factor | none | 0.0016 | 0.0018 | 0.0020 | 0.0018 | 0.0017 |
| thermal conductivity | W/(m · K) | 1.21 | 1.31 | 1.15 | 1.20 | 1.21 |
| copper foil peeling strength | lb/in | 4.0 | 4.3 | 4.6 | 4.1 | 4.1 |
| routing distance | m | 30 | 30 | 31 | 30 | 31 |
| bending ability | cycle | 487 | 323 | 400 | 424 | 446 |
| elongation | % | 13.3 | 10.1 | 11.8 | 12.7 | 16.5 |

TABLE 5

| Resin compositions of Examples (in part by weight) and test results | | | | | | |
|---|---|---|---|---|---|---|
| Component | Name | E11 | E12 | E13 | E14 | E15 |
| Prepolymer | Prepolymer 1 | 100 | 100 | | | |
| | Prepolymer 2 | | | | 30 | |
| | Prepolymer 3 | | | | | |
| | Prepolymer 4 | | | | 20 | 10 |
| | Prepolymer 5 | | | | | 40 |
| | Prepolymer 6 | | | | | |
| | Prepolymer 7 | | | 100 | 50 | 50 |
| | Prepolymer 8 | | | | | |
| | Prepolymer 9 | | | | | |
| | Prepolymer 10 | | | | | |
| | Prepolymer 11 | | | | | |
| | Prepolymer 12 | | | | | |
| Monomer | BMI-80 | | | | | |
| | BMI-TMH | | | | | |
| | Formula (1) | | | | | |
| | Formula (2-1) | | | | | |
| | Formula (2-2) | | | | | |
| | Formula (2-3) | | | | | |
| | Formula (3) | | | | | |
| Ceramic filler | BN | 200 | 150 | 180 | 50 | 50 |
| | AlN | | | | 130 | 120 |
| | MgO | | | | 20 | 30 |
| Other filler | ZnO | | | | | |
| | $SiO_2$ | | | | | |
| Additive | NC-3000 | | | | 2 | 5 |
| | BE-188 | | | | 1 | 5 |
| | Albiflex297 | | | | 1 | 2 |
| | SA9000 | | | | 1 | 23 |
| Catalyst | 2PZ-CN | 0.25 | 0.25 | 0.25 | 0.1 | 0.35 |
| Solvent | MEK | 150 | 150 | 150 | 100 | 180 |
| Property | Unit | E11 | E12 | E13 | E14 | E15 |
| dielectric constant | none | 4.69 | 4.71 | 4.20 | 4.15 | 4.13 |
| dissipation factor | none | 0.0020 | 0.0017 | 0.0016 | 0.0015 | 0.0015 |
| thermal conductivity | W/(m · K) | 1.28 | 1.06 | 1.24 | 1.75 | 1.76 |
| copper foil peeling strength | lb/in | 4.0 | 4.2 | 4.2 | 4.6 | 4.7 |
| routing distance | m | 29 | 31 | 30 | 30 | 31 |
| bending ability | cycle | 403 | 452 | 482 | 483 | 485 |
| elongation | % | 11.3 | 12.5 | 12.3 | 16.3 | 16.6 |

TABLE 6

| Resin compositions of Comparative Examples (in part by weight) and test results | | | | | | | |
|---|---|---|---|---|---|---|---|
| Component | Name | C1 | C2 | C3 | C4 | C5 | C6 |
| Prepolymer | Prepolymer 1 | | | | | | 100 |
| | Prepolymer 2 | | | | | | |
| | Prepolymer 3 | | | | | | |
| | Prepolymer 4 | | | | | | |
| | Prepolymer 5 | | | | | | |
| | Prepolymer 6 | | | | | | |
| | Prepolymer 7 | | | | | | |
| | Prepolymer 8 | | | | | | |
| | Prepolymer 9 | | | | | | |
| | Prepolymer 10 | | | | | | |
| | Prepolymer 11 | | | | | | |
| | Prepolymer 12 | | | | | | |
| Monomer | BMI-80 | 77 | 68 | 68 | 68 | | |
| | BMI-TMH | | | | | 64 | |
| | Formula (1) | 23 | | | | | |
| | Formula (2-1) | | 32 | | | | |
| | Formula (2-2) | | | 32 | | | |
| | Formula (2-3) | | | | 32 | | |
| | Formula (3) | | | | | 36 | |
| Ceramic filler | BN | 180 | 180 | 180 | 180 | 180 | |
| | AlN | | | | | | |
| | MgO | | | | | | |
| Other filler | ZnO | | | | | | 180 |
| | $SiO_2$ | | | | | | |
| Additive | NC-3000 | | | | | | |
| | BE-188 | | | | | | |
| | Albiflex297 | | | | | | |
| | SA9000 | | | | | | |
| Catalyst | 2PZ-CN | 0.25 | 0.25 | 0.25 | 0.25 | 0.25 | 0.25 |
| Solvent | MEK | 150 | 150 | 150 | 150 | 150 | 150 |
| Property | Unit | C1 | C2 | C3 | C4 | C5 | C6 |
| dielectric constant | none | 5.54 | 5.56 | 5.55 | 5.54 | 5.74 | 5.70 |
| dissipation factor | none | 0.0024 | 0.0023 | 0.0024 | 0.0024 | 0.0023 | 0.0021 |
| thermal conductivity | W/(m · K) | 1.21 | 1.21 | 1.20 | 1.22 | 1.21 | 0.79 |
| copper foil peeling strength | lb/in | 4.5 | 3.4 | 3.5 | 3.5 | 2.4 | 4.8 |
| routing distance | m | 10 | 13 | 13 | 13 | 17 | 24 |
| bending ability | cycle | 135 | 145 | 143 | 142 | 150 | 186 |
| elongation | % | 1.1 | 1.3 | 1.3 | 1.2 | 4.2 | 9.3 |

TABLE 7

| Resin compositions of Comparative Examples (in part by weight) and test results | | | | | | | |
|---|---|---|---|---|---|---|---|
| Component | Name | C7 | C8 | C9 | C10 | C11 | C12 |
| Prepolymer | Prepolymer 1 | 100 | 100 | 100 | | | |
| | Prepolymer 2 | | | | | | |
| | Prepolymer 3 | | | | | | |
| | Prepolymer 4 | | | | | | |
| | Prepolymer 5 | | | | | | |
| | Prepolymer 6 | | | | | | |
| | Prepolymer 7 | | | | | | |
| | Prepolymer 8 | | | | | | |
| | Prepolymer 9 | | | | | | |
| | Prepolymer 10 | | | | 100 | | |
| | Prepolymer 11 | | | | | 100 | |
| | Prepolymer 12 | | | | | | 100 |
| Monomer | BMI-80 | | | | | | |
| | BMI-TMH | | | | | | |
| | Formula (1) | | | | | | |
| | Formula (2-1) | | | | | | |
| | Formula (2-2) | | | | | | |
| | Formula (2-3) | | | | | | |
| | Formula (3) | | | | | | |
| Ceramic filler | BN | | 250 | 100 | 180 | 180 | 180 |
| | AlN | | | | | | |
| | MgO | | | | | | |

TABLE 7-continued

| Resin compositions of Comparative Examples (in part by weight) and test results | | | | | | | |
|---|---|---|---|---|---|---|---|
| Other filler | ZnC | | | | | | |
| | $SiO_2$ | 180 | | | | | |
| Additive | NC-3000 | | | | | | |
| | BE-188 | | | | | | |
| | Albiflex297 | | | | | | |
| | SA9000 | | | | | | |
| Catalyst | 2PZ-CN | 0.25 | 0.25 | 0.25 | 0.25 | 0.25 | 0.25 |
| Solvent | MEK | 150 | 150 | 150 | 150 | 150 | 150 |
| Property | Unit | C7 | C8 | C9 | C10 | C11 | C12 |
| dielectric constant | none | 5.21 | 4.76 | 4.54 | 5.44 | 4.84 | 5.51 |
| dissipation factor | none | 0.0025 | 0.0022 | 0.0016 | 0.0024 | 0.0025 | 0.0023 |
| thermal conductivity | W/(m · K) | 0.51 | 1.43 | 0.72 | 1.17 | 1.01 | 1.06 |
| copper foil peeling strength | lb/in | 4.4 | 2.6 | 4.3 | 3.3 | 4.0 | 3.2 |
| routing distance | m | 22 | 14 | 36 | 9 | 25 | 12 |
| bending ability | cycle | 255 | 174 | 225 | 180 | 228 | 180 |
| elongation | % | 9.3 | 1.4 | 8.8 | 2.9 | 8.5 | 3.2 |

Samples (specimens) for the properties measured above were prepared as described below and tested and analyzed under specified conditions below.

1. Resin film: Resin composition from each Example or each Comparative Example, in part by weight, was individually added to a stirred tank and well-mixed to form a varnish, which was coated on a copper foil (product name MT18Ex, containing 18 μm carrier copper foil and 3 μm thin copper, available from Mitsui Kinzoku) to uniformly adhere the resin composition thereon, followed by heating and baking at 100 °C for 10 minutes. After removing the 18 μm carrier copper foil, the 3 μm thin copper was removed by etching to obtain a resin film with a thickness of 32.5 μm.
2. Prepreg (PP): Resin composition (in part by weight) from each Example or each Comparative Example was separately added to a stirred tank and well-mixed to form a varnish. Then the varnish was loaded to an impregnation tank, and a fiberglass fabric (e.g., 1078 L-glass fiber fabric, available from Shin-Etsu) was impregnated into the impregnation tank to adhere the resin composition onto the fiberglass fabric, followed by heating at 100 °C to 120 °C to the semi-cured state (B-stage) to obtain a prepreg, having a resin content of about 80%.
3. Copper-containing laminate 1 (formed by lamination of one prepreg): Two 1 oz high temperature elongation (HTE) copper foils and a prepreg obtained from 1078 L-glass fiber fabric impregnated with each Example or Comparative Example were prepared, each prepreg having a resin content of about 80%. A copper foil, one prepreg and a copper foil were superimposed in such order and then subjected to a vacuum condition for lamination at 250 psi to 600 psi and 200 °C to 220 °C for 90 minutes to 120 minutes to form each copper-containing laminate 1. A prepreg was cured to form an insulation layer between the two copper foils, and the insulation layer has a resin content of about 80%.
4. Copper-containing laminate 2 (formed by lamination of two prepregs): The preparation method was substantially the same as copper-containing laminate 1, except that the insulation layer was formed by curing two prepregs.
5. Copper-containing laminate 3 (formed by lamination of six prepregs): The preparation method was substantially the same as copper-containing laminate 1, except that the insulation layer was formed by curing six prepregs.
6. Copper-containing laminate 4 (formed by lamination of eight prepregs): The preparation method was substantially the same as copper-containing laminate 1, except that the insulation layer was formed by curing eight prepregs.
7. Copper-free laminate 1 (obtained by lamination of two prepregs): Each copper-containing laminate 2 made by laminating two prepregs obtained above was etched to remove the copper foils on both sides so as to obtain the copper-free laminate 1 (obtained by laminating two prepregs).
8. Copper-free laminate 2 (obtained by lamination of eight prepregs): Each copper-containing laminate 4 made by laminating eight prepregs obtained above was etched to remove the copper foils on both sides so as to obtain the copper-free laminate 2 (obtained by laminating eight prepregs).

For each sample, test items and test methods are described below.

Dielectric Constant (Dk)

The aforesaid copper-free laminate 1 (obtained by laminating two prepregs, having a resin content of about 80%) was subject to dielectric constant measurement. Each sample was measured by using a microwave dielectrometer (available from AET Corp.) by reference to JIS C2565 at room temperature (about 25 °C) and under 10 GHz frequency. Under a 10 GHz frequency, for a low Dk material, a difference in Dk of less than 0.3 represents no substantial difference (i.e., no significant technical difficulty) in dielectric constant in different laminates, and a difference in Dk of greater than or equal to 0.3 represents a substantial difference (i.e., significant technical difficulty) in dielectric constant in different laminates.

Dissipation Factor (Df)

The aforesaid copper-free laminate 1 (obtained by laminating two prepregs, having a resin content of about 80%) was subject to dissipation factor measurement. Each sample was measured by using a microwave dielectrometer (available from AET Corp.) by reference to JIS C2565 at room temperature (about 25 °C) and under 10 GHz frequency to obtain the dissipation factor. Lower dissipation factor represents better dielectric properties of the sample. Under a 10 GHz frequency, for a Df value of between 0.0010 and 0.0030, a difference in Df of less than 0.0005 represents no substantial difference (i.e., no significant technical difficulty) in dissipation factor in different laminates, and a difference in Df of greater than or equal to 0.0005 represents a substantial difference (i.e., significant technical difficulty) in dissipation factor in different laminates.

Thermal Conductivity (Tk)

The aforesaid copper-free laminate 2 sample (obtained by laminating eight prepregs) with a size of 31 mm*31 mm*0.85 mm was tested by reference to the processes described in ASTM-D5470. The sample was heated by a test apparatus from room temperature (about 25 °C), and after 30 minutes of heating when the temperature was 80 °C, a thermal conductivity measurement instrument (model No. LW-9091 ir, available from Long Win Science and Technology Corporation) was used to calculate and analyze to obtain the thermal conductivity. The unit of thermal conductivity is W/(m·K). In the technical field to which the present disclosure pertains, a difference in Tk of less than 0.1 W/(m·K) represents no substantial difference (i.e., no significant technical difficulty) in thermal conductivity of laminates, and a difference in Tk of greater than or equal to 0.1 W/(m·K) represents a substantial difference (i.e., significant technical difficulty) in thermal conductivity in different laminates.

Copper Foil Peeling Strength (1 Ounce, 1 oz Peeling Strength, 1 Oz P/S)

The aforesaid copper-containing laminate 3 (obtained by laminating six prepregs) was cut into a rectangular sample with a width of 24 mm and a length of greater than 60 mm, which was etched to remove surface copper foil to leave a rectangular copper foil with a width of 3.18 mm and a length of greater than 60 mm, and tested by using a tensile strength tester by reference to IPC-TM-650 2.4.8 at room temperature (about 25 °C) to measure the force (lb/in) required to separate the 1 ounce copper foil from the insulation layer of the laminate. In the technical field to which the present disclosure pertains, higher copper foil peeling strength is better. Under a 10 GHz frequency, for a copper-clad laminate with a Df value of between 0.0010 and 0.0030, a difference in copper foil peeling strength of greater than or equal to 0.4 lb/in represents a substantial difference (i.e., significant technical difficulty) in copper foil peeling strength in different laminates.

Routing Distance

The aforesaid copper-containing laminate 1 (obtained by laminating one prepreg, with a size of 18 inches in length and 16 inches in width) was tested by a numerical control forming machine (routing machine, model No. TQZX-II) and was milled by a milling cutter with a diameter of 1.6 mm (product name: DCR-1700) based on the designed patterns. After the milling cutter was broken, the milling process was stopped, and the total travel length along the patterns before the milling cutter broke was measured in meter (m). In the technical field to which the present disclosure pertains, longer routing distance is better, which represents higher wear resistance against a milling cutter, lower costs of consumables and better toughness. A difference in routing distance of greater than or equal to 3 meters represents a substantial difference (i.e., significant technical difficulty) in routing distance of laminates.

Bending Ability

The aforesaid copper-free laminate 1 (obtained by laminating two prepregs) was subject to the bending ability test by reference to JIS C 6471 by using a bending resistance tester after the circuit was etched. Bending was carried out at a radius of curvature of 1.0 mm, a bending angle of 180 degrees, and a bending speed of 60 cycles/minute, so as to measure the bending cycles until the circuit was broken. A difference in bending cycles of greater than or equal to 35 cycles represents a substantial difference (i.e., significant technical difficulty) in bending ability of laminates.

Elongation

The resin film sample was subject to the measurement. The sample was tested by using a tensile strength tester, by reference to ASTM D412 at a tensile rate of 50.8 mm/min, to measure the elongation at break of the sample. A difference in elongation of greater than or equal to 1% represents a substantial difference (i.e., significant technical difficulty) in elongation of resin films.

The following observations can be made according to the test results above.

If the resin composition, such as Comparative Examples C1-C5, does not contain any prepolymers, but contains a monomer combination of a maleimide resin and a diamine compound, the article made therefrom will fail to achieve desirable improvement in at least one of the properties including dielectric constant, dissipation factor, copper foil peeling strength, routing distance, bending ability and elongation.

If the resin composition, such as Comparative Examples C6 and C7, does not contain a ceramic filler with a thermal conductivity of greater than 30 W/(m·K), but contains a filler with a thermal conductivity of less than 30 W/(m·K), the article made therefrom will fail to achieve desirable improvement in at least one of the properties including dielectric constant, dissipation factor, thermal conductivity, routing distance, bending ability and elongation.

In the resin composition of Comparative Examples C8 and C9, if the amount of the ceramic filler is not in the range of 150 to 200 parts by weight, the article made therefrom will fail to achieve desirable improvement in at least one of the properties including dissipation factor, thermal conductivity, copper foil peeling strength, routing distance, bending ability and elongation.

If the resin composition, such as Comparative Examples C10-C12, does not contain the prepolymer of the present disclosure, but contains other prepolymers, the article made therefrom will fail to achieve desirable improvement in at least one of the properties including dielectric constant, dissipation factor, thermal conductivity, copper foil peeling strength, routing distance, bending ability and elongation.

In contrast, the resin composition of the present disclosure, such as Examples E1-E15, can achieve at the same time at least one, more or all desirable properties including a dielectric constant of less than or equal to 5.05, a dissipation factor of less than or equal to 0.0020, a thermal conductivity of greater than or equal to 1.06 W/(m. K), a copper foil peeling strength of greater than or equal to 4.0 lb/in, a bending ability of greater than or equal to 323 cycles, an elongation of greater than or equal to 10.1% and a routing distance of greater than or equal to 28 meters.

The above detailed description is merely illustrative in nature and is not intended to limit the embodiments of the subject matter or the application and use of such embodiments. As used herein, the term “exemplary” means “serving as an example, instance, or illustration.” Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A resin composition comprising 100 parts by weight of a prepolymer and 150 to 200 parts by weight of a ceramic filler, wherein:

the prepolymer is prepared from a mixture subjected to a prepolymerization reaction, and the mixture comprises a maleimide resin and a diamine compound in a molar ratio of between 1:2 and 2:1;

the ceramic filler has a thermal conductivity of greater than 30 W/(m·K), and the ceramic filler comprises aluminum oxide, aluminum nitride, silicon carbide, boron nitride, silicon nitride, magnesium oxide, or a combination thereof; and the diamine compound comprises a compound of Formula (1), a compound of Formula (2), a compound of Formula (3) or a combination thereof:

Formula (1)

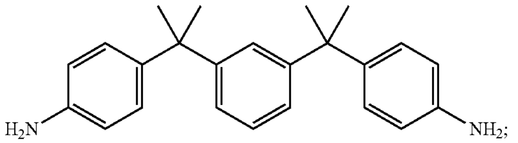

Formula (2)

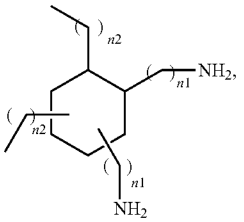

wherein each n1 is independently an integer of 6 to 8, and each n2 is independently an integer of 5 to 8;

Formula (3)

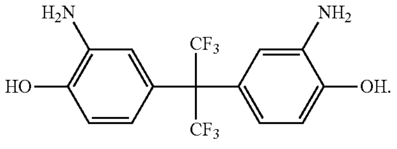

2. The resin composition of claim 1, wherein the ceramic filler has a thermal conductivity of greater than 30 W/(m·K) and less than 320 W/(m·K).

3. The resin composition of claim 1, wherein the mixture is subjected to the prepolymerization reaction at 70 °C to 150 °C for 1 to 20 hours to prepare the prepolymer.

4. The resin composition of claim 1, wherein the maleimide resin and the diamine compound have a conversion rate of between 10% and 90%.

5. The resin composition of claim 1, wherein the maleimide resin comprises 4,4'-diphenylmethane bismaleimide, polyphenylmethane maleimide, bisphenol A diphenyl ether bismaleimide, 3,3'-dimethyl-5,5'-diethyl-4,4'-diphenylmethane bismaleimide, 3,3'-dimethyl-5,5'-dipropyl-4,4'-diphenylmethane bismaleimide, m-phenylene bismaleimide, 4-methyl-1,3-phenylene bismaleimide, 1,6-bismaleimide-(2,2,4-trimethyl)hexane, N-2,3-xylylmaleimide, N-2,6-xylylmaleimide, N-phenylmaleimide, vinyl benzyl maleimide, maleimide containing biphenyl structure, maleimide containing aliphatic long chain structure, prepolymer of diallyl compound and maleimide, prepolymer of multi-functional amine and maleimide, prepolymer of acid phenol compound and maleimide, or a combination thereof.

6. The resin composition of claim 1, further comprising epoxy resin, vinyl group-containing polyphenylene ether resin, flame retardant, curing accelerator, polymerization inhibitor, solvent, silane coupling agent, coloring agent, toughening agent, or a combination thereof.

7. An article made from the resin composition of claim 1, comprising a prepreg, a resin film, a laminate or a printed circuit board.

8. The article of claim 7, having a dielectric constant as measured by reference to JIS C2565 at 10 GHz of less than or equal to 5.05.

9. The article of claim 7, having a dissipation factor as measured by reference to JIS C2565 at 10 GHz of less than or equal to 0.0020.

10. The article of claim 7, having a thermal conductivity as measured by reference to ASTM-D5470 of greater than or equal to 1.06 W/(m·K).

11. The article of claim 7, having a copper foil peeling strength as measured by reference to IPC-TM-650 2.4.8 of greater than or equal to 4.0 lb/in.

12. The article of claim 7, having a bending ability as measured by reference to JIS C 6471 of greater than or equal to 323 cycles.

13. The article of claim 7, having an elongation as measured by reference to ASTM D412 of greater than or equal to 10.1%.

14. The article of claim 7, having a routing distance of greater than or equal to 28 meters.

* * * * *